United States Patent [19]

Cox

[11] 4,130,794

[45] Dec. 19, 1978

[54] METHODS AND MEANS FOR IDENTIFYING AND TESTING CIRCUIT CONNECTIONS

[76] Inventor: C. Eugene Cox, 2738 W. Strawberry La., Santa Ana, Calif. 92701

[21] Appl. No.: 739,060

[22] Filed: Nov. 5, 1976

[51] Int. Cl.² .............................................. G01R 31/02
[52] U.S. Cl. ............................... 324/51; 179/175.3 A; 324/66
[58] Field of Search ..................... 324/51, 66, 73 R; 179/175.3 R, 175.3 A, 175.3 F

[56] References Cited

U.S. PATENT DOCUMENTS

| | | | |
|---|---|---|---|
| 3,594,635 | 7/1971 | Minamii et al. | 324/51 |
| 3,699,438 | 10/1972 | Webb | 324/51 X |
| 3,728,616 | 4/1973 | Cheek et al. | 324/66 X |
| 3,818,329 | 6/1974 | Reaves | 324/66 X |
| 3,868,566 | 2/1975 | Parsons et al. | 324/51 |
| 4,015,200 | 3/1977 | Strandh | 324/51 |

Primary Examiner—Gerard R. Strecker

Attorney, Agent, or Firm—Grover A. Frater

[57] ABSTRACT

The task of identifying the terminals to be interconnected and not interconnected, and whether connection is proper in a complex electrical system, such as at the main distribution frame of a telephone central office, is made possible while the system is in operation under power without adversely affecting its operation of being adversely effected. This is done by connecting the combination of a load impedance and a test voltage source across the test points and measuring the voltage across the load. If the measured voltage exceeds the test voltage, the load impedance is maintained at a high value. If it does not exceed the test voltage, the value of the impedance is reduced for the test. Thus, the test impedance is either greater or lesser than the impedance presented by the telephone system at the test terminals. The test results are interpreted in the view of whether the test terminals should or should not be connected when properly wired.

15 Claims, 8 Drawing Figures

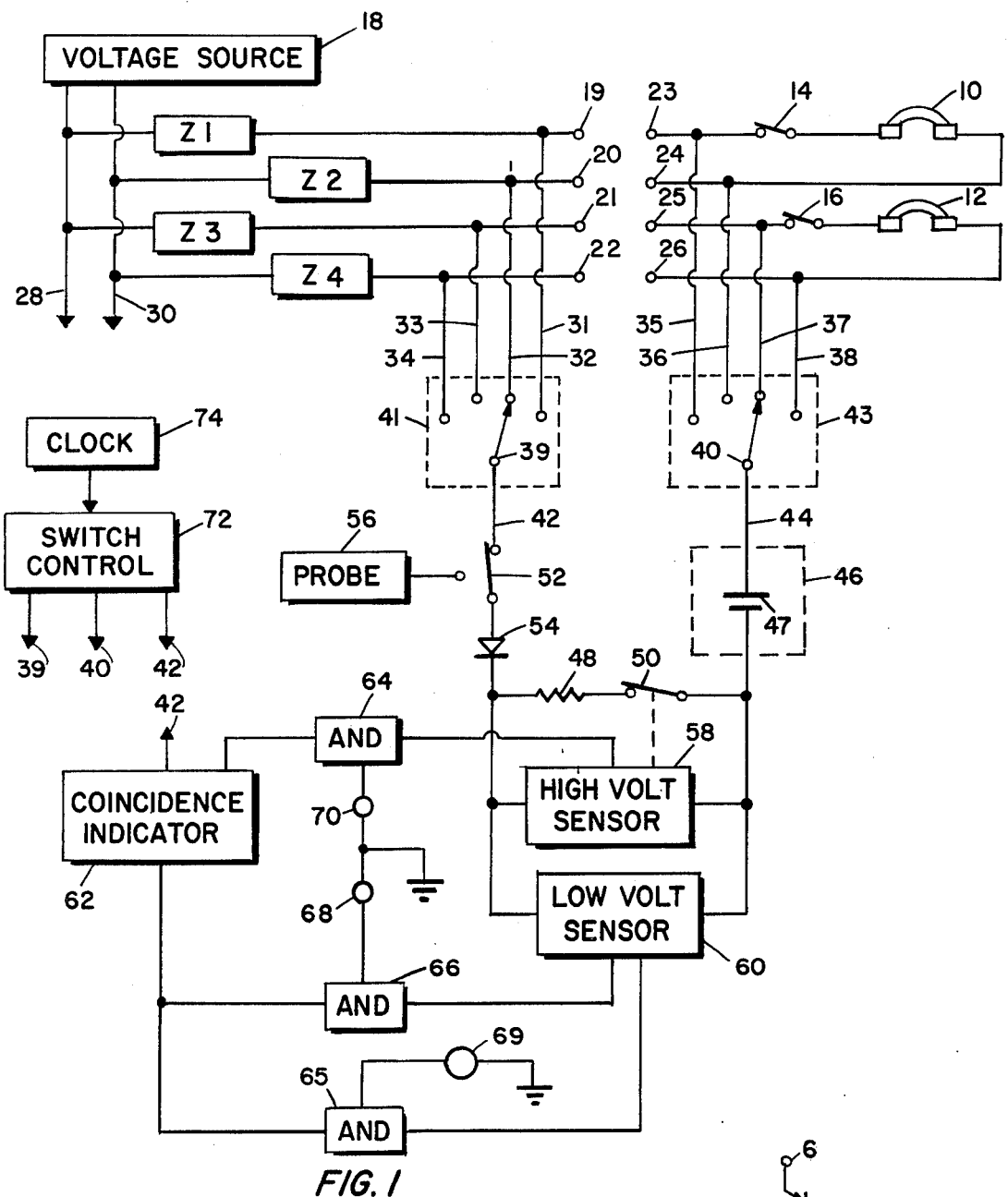
FIG. 1
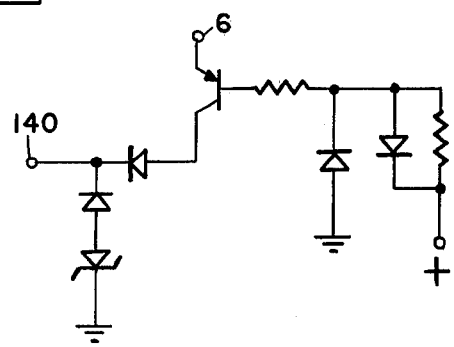
FIG. 2
FIG. 8

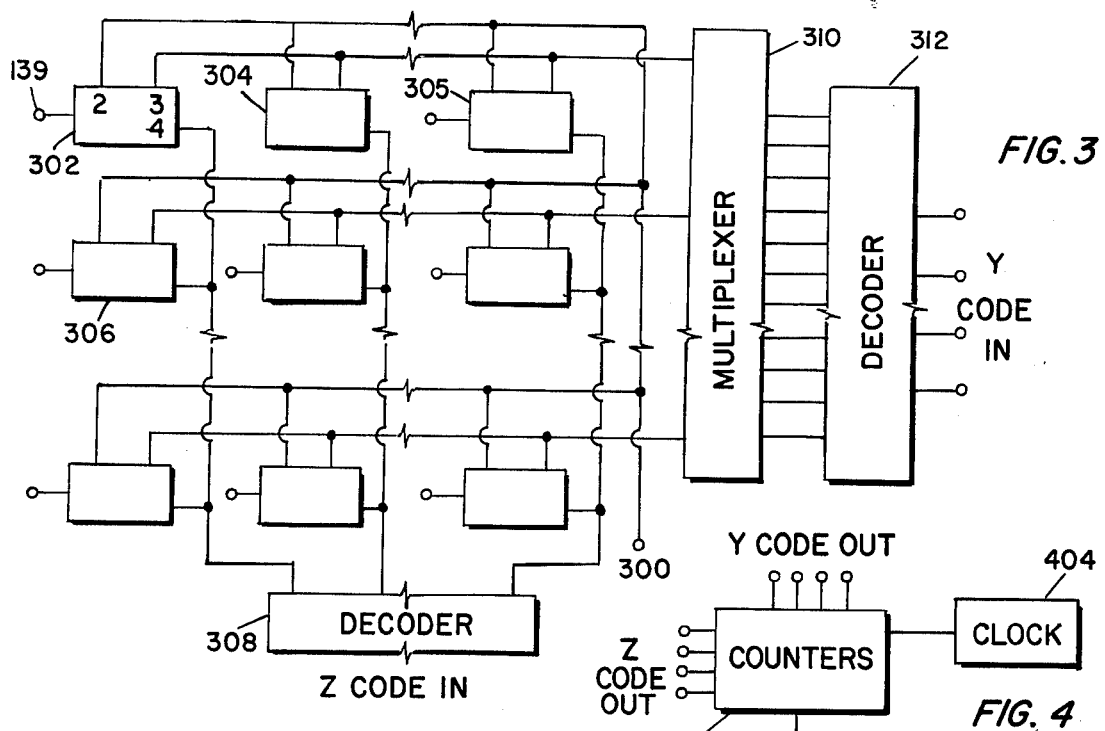
FIG. 3
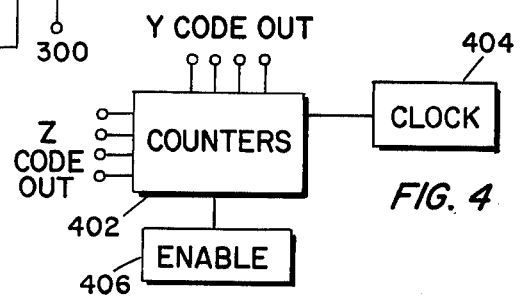
FIG. 4
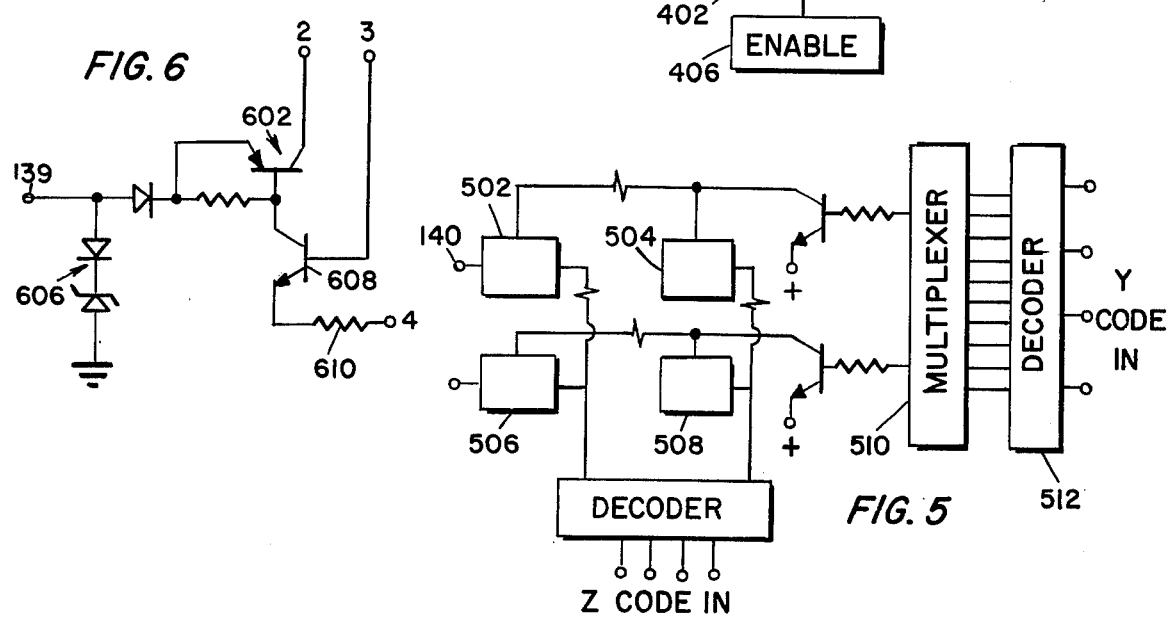
FIG. 6
FIG. 5
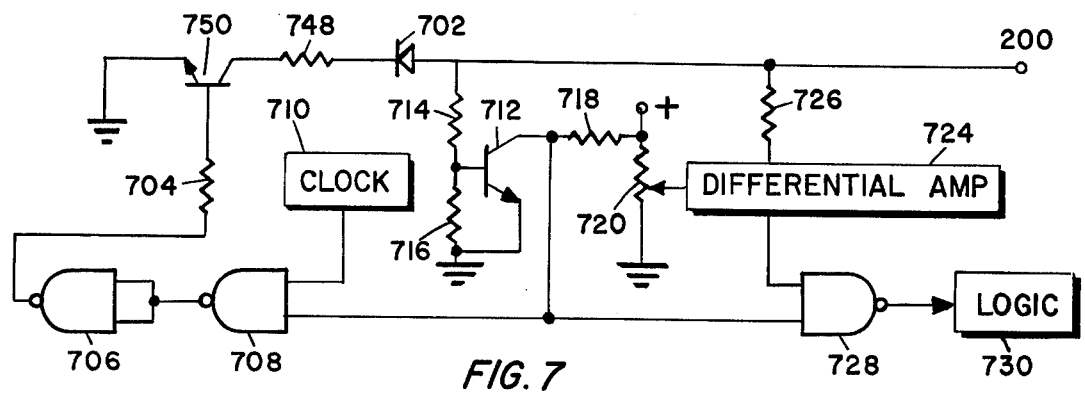
FIG. 7

METHODS AND MEANS FOR IDENTIFYING AND TESTING CIRCUIT CONNECTIONS

This invention relates to improved methods and to improved means for identifying circuit test points, and verifying the correctness of inter-circuit connections, in multi-connection electric circuits. While not limited thereto, the invention is particularly useful in wiring and testing main distribution frames in central telephone offices.

BACKGROUND OF THE INVENTION

Telephone systems and certain kinds of electrically powered control systems and security systems and certain kinds of electrically powered distribution systems are characterized in that many remotely positioned pieces of apparatus are interconnected with power sources and other apparatus at a central location. The telephone system is an example. Many remotely positioned subscriber telephones are interconnected with relay and switching apparatus at a central office. Interconnection is accomplished by attaching subscriber lines to switch gear, and that is accomplished by bridging terminals at a structure that is usually called a "main distribution frame."

When connection and disconnection is to be made between telephone circuit lines and apparatus that is disconnected from any electrical power source, the task of identification and connection is relatively simple. The task is made complicated, however, when the work must be done on a telephone system and frame that is energized and in operation. The problem is to avoid adversely effecting telephone calls in process. The problem is particularly severe when digital data is being transmitted through the system. In that case, the test activity must not introduce transient spikes that might look like data bits.

The magnitude that can be reached in the problem can be understood by envisioning the circumstance in which the main distribution frame of a telephone system is to be replaced with a new frame without interrupting normal operation of the system as energized, or "wet," lines are connected to the new frame and disconnected from the old. It appears that none of the continuity testers or wire identification apparatus of the prior art is capable of performing the task without producing an effect upon the system that might be disruptive of telephone calls in process, or that might result in unwanted circuit switching.

Just what the total effect of existing continuity testers and wire identification systems would be in that application is difficult to predict. Various telephone companies have adopted somewhat different standards. They employ different apparatus, and apparatus that is added to systems is often different in its electrical character from older apparatus in the same system. Voltages, impedance values, circuit routes are different from system to system, and within systems.

Essentially, the problem in identifying terminals and completing jumper connections involves placing one end of a continuity tester probe on one terminal or wire at one side of the main distribution frame and then looking for the corresponding terminal or wire on the other side of the frame by touching terminals and wires until the instrument indicates that there is continuity. The process ordinarily involves making many incorrect connections in order to find the correct one. That is, in fact, one preferred mode of operation. The task of interconnection is greatly simplified if the wire person can connect one side of the continuity tester to a terminal on one side of the frame and then run a connector probe, picket-fence fashion, over the terminals at the opposite side to identify at which terminals there is continuity.

A continuity tester must include a voltage source so that it can identify continuity in otherwise unpowered circuits. The problem is how to create a continuity tester, and how to conduct a continuity testing process in a way that will preclude testing voltage source from adversely effecting the operating telephone system, and in a way that will prevent the power sources of the system from causing erroneous test results.

SUMMARY OF THE INVENTION

It is an object of this invention to provide a continuity test apparatus and method which solves some or all of the deficiencies of prior art testers in this application. It is a particular object of the invention to provide a continuity tester which will not have an adverse effect upon the system in which it is used when the tester is connected across circuit points whether or not those circuit points are energized. It is a related object to provide a method and apparatus that is applicable to the task of identifying terminal points that are to be interconnected and testing to determine whether they are indeed interconnected, and that is applicable to conducting such tests at high speed in a system employing many, many terminals. It is an object to provide a method and an apparatus that may safely be applied to circuitry, notwithstanding that application would result in short circuits in energized circuitry.

These and other objects and advantages of the invention are realized in part by connecting the series combination of an adjustable load impedance and an electrical power source across the terminals to be identified or tested, and in parallel with a volt meter. If the voltage across the series circuit exceeds the potential of its source, the impedance of the load is maintained at a high value. Its value is reduced if the voltage across the load is substantially that of the power source of the series circuit or less than that value. The impedance change ensures that the impedance of the test circuit is much greater or much lesser than the impedance seen when looking into the telephone system from the test terminals. The presence of an over voltage, or an under voltage, at the voltage measuring instrument is interpreted as a fault or correct condition, depending upon whether or not the terminals across which measurements are made are or are not intended to be interconnected.

IN THE DRAWINGS

FIG. 1 is a diagram of a continuity measuring system according to the invention connected to a schematic representation of a telephone system;

FIG. 2 is a chart for interpreting the results of a measurement made in FIG. 1;

FIGS. 3, 4, and 5 are more detailed schematic diagrams of portions of the system of FIG. 1;

FIG. 6 is a circuit diagram of a portion of FIG. 3;

FIG. 7 is a diagram partially schematic and partially in block form, of another portion of the system of FIG. 1; and FIG. 8 is a circuit diagram of a portion of FIG. 5.

DETAILED DESCRIPTION OF A PREFERRED EMBODIMENT

The basic circuit in a telephone system is the interconnection of two subscriber telephones with a unidirectional voltage source in a series loop. In practice, the circuit may include switches, relay coils, amplifiers, and a host of other devices. Each telephone company adopts standards and circuit arrangements that may differ somewhat by those adopted by other companies. As a consequence of renovation, and the adoption of new apparatus, there are often very substantial differences between several portions of the same telephone system.

For the purpose of the invention, differences in telephone systems means differences in the impedance and in the potentials that are observed when looking at the system from the terminals of a main distribution frame. In most telephone systems, the interconnection between the pairs of lines from subscribers' telephones to the remainder of the system is accomplished at a main distribution frame. In general, subscribers' telephones are connected to terminals at "one side" of the frame, and they are wired into the system by connecting jumpers between the terminals at that "one side" of the frame and appropriate terminals at the "other side" of the main distribution frame. That most telephone systems employ main distribution frames makes it possible to draw a representative telephone system, and that has been done in the upper part of FIG. 1. That system includes subscribers' telephones 10 and 12 which are connected in series with switches 14 and 16 to terminals 23, 24, 25, and 26 at the "right side" of a main distribution frame. Terminals 23, 24, 25, and 26 are to be connected to terminals 19, 20, 21, and 22 at the "left side" of the main distribution frame when the subscriber telephone has been wired into the system. Terminals 19, 20, 21, and 22 are connected to a voltage source 18 through impedance elements Z1, Z2, Z3, and Z4, respectively. The power lines 28 ad 30 are continued to indicate that there are portions of the system beyond what is shown in FIG. 1. Once the interconnecting wires of the main distribution frame are properly installed the circuit is relatively simple. However, as subscriber telephones are added or disconnected from the system, or when the system is first installed, or when the main frame itself is to be replaced, some interconnecting wires will be removed. Other interconnections may be made correctly or incorrectly. Thus, between any pair of terminals, there may be a proper connection or an open circuit or a short circuit. It will be apparent from an examination of the upper portion of FIG. 1 that continuity test conducted from each of the terminals at the right of the main distribution frame in FIG. 1 to each of the terminals at the left will give rise to a variety of test results, indicating differences in voltage magnitude, in voltage polarity, and in the impedance that is measured. The number of those variables is increased if it is envisioned that bridging connections between the right and left sides of the frame are made correctly, incorrectly, or not at all. The purpose here is to provide a method for testing and terminal identification that can be used, while the system is in service and under voltage, to determine whether the connections across the main frame have been made, and whether or not they have been made correctly. A related but less complex task is identify pairs of terminals that are to be interconnected.

The invention can be thought of as providing a method and an apparatus for accomplishing electrical continuity testing. In FIG. 1, the series combination of the load resistor 48 and normally closed switch 50 is called the load circuit. It is connected between the rotator 39 of switch 41 and the rotator 40 of switch 43 in a circuit that can be traced from rotor 39, line 42, normally closed switch 52, diode 54, load resistor 48, switch 50, unidirectional power source 46, in the farm of a battery 47, and a line 44, to the rotor 40 of switch 43. Switches 41 and 43 are shown as single-pole, multiple-throw switches by which line 42 can be connected to any one of terminals 19, 20, 21, and 22, at the left side of the main distribution frame, and by which line 44 can be connected to any one of the terminals 23, 24, 25, and 26 at the right side of the main distribution frame. Thus, the load circuit can be placed across any pair of terminals in the main frame, one at the right and one at the left.

In a complete continuity check, the movable contact 40 of the switch 43 would be connected to terminal 23. The movable contact 39 of switch 41 would then be rotated to connect to each of the terminals at the left, in turn. Thereafter, switch 43 would be adjusted to connect its movable contact to terminal 24. Then, switch 39 would be adjusted to contact each of the contacts at the left in turn, and so on until all combinations of terminals had been tested whereby to discover proper connections, all open circuits, and all short circuits.

The switches are connected to the terminals of the main frame so that the terminals, both at the right and at the left, are contacted in a predetermined known order. Terminals 19 and 23 are to be interconnected as are terminals 20 and 24, and terminals 21 and 25, and terminals 22 and 26. When the switches 41 and 43 are adjusted so that lines 42 and 44 are connected to terminals 19 and 23 by lines 31 and 35, respectively, the circuit is said to be in "coincidence." Similarly, when the switches interconnect terminals 20 and 24 by lines 32 and 36, respectively, the switches are said to be in "coincidence." So, too, when switches contact terminals 21 and 25 by lines 33 and 37, respectively, and when the switches contact terminals 22 and 26 by lines 34 and 38, respectively. In any other combination of switch position, associates are said to be "out of coincidence" or there is "no coincidence."

When the switches are in coincidence across a pair of terminals that are properly interconnected, a path for electrical current from battery 47 is established across those terminals and through the switches and the diode 54, and through the load circuit. A voltage corresponding to the voltage of battery 47 less any resistance drop in the circuit and less the diode drop across diode 54 will appear across load resistor 48. Two volt meters are provided in FIG. 1 by which that voltage is measured. One of them is called a high volt sensor 58 and the other is called a low volt sensor 60. If all parts of the telephone system were to be removed from the main frame, the appearance of a voltage across resistor 48 would indicate a proper connection when the switches are in coindence, and they would indicate a short circuit when the switches were not in coincidence. The absence of a voltage across resistor 48 when the switches are in coincidence would indicate an open circuit at the connectors at which the measurement was made, and failure to find a voltage across resistor 48 when the switches were not in coincidence would indicate a proper condition.

However, when the remainder of the telephone system is connected to the main distribution frame, the matter is not so simple. Remembering that the terminals of the main frame are normally interconnected, many parallel paths are formed between every possible combination of left and right terminals. Those parallel paths include one or more voltage sources, and they include different numbers of impedance elements, and different values of impedance. Moreover, these parameters change as telephones are switched into and out of the system during the course of making the measurement. Thus it is that a connection may be indicated between pairs of terminals notwithstanding that there is no jumper between those terminals. Further, it is possible, by connecting the test apparatus to the telephone system, to complete interconnections that will have an adverse effect upon the system. An object of the invention is to provide an apparatus that will permit normal operation of the system during the test procedure. Accordingly, the test apparatus must be able to distinguish between jumper wires between main frame terminals and a circuit path through the remainder of the system, and it must be arranged so that its connection to the main frame will not introduce impedance or voltage variations that will interrupt normal operation.

Moreover, to be useful as a general purpose instrument, a continuity tester must be capable of performing properly regardless of the characteristics of the individual telephone system to which it is connected. The invention provides such an apparatus. While it is conceivable that there are telephone systems with which it cannot be successfully employed, no such telephone system has thus far been discovered.

In a typical system, the open circuit voltage of battery 47 is 8 volts. The value of resistance 48 is about 200 ohms. In systems that exhibit low line impedance, the value of resistor 48 might be reduced. In one case, it was reduced to 60 ohms. In practice, the switch 50 is a solid state device which exhibits only a few ohms impedance when "closed," and thousands of ohms of impedance when "open." A mechanical switch may be employed, but a solid switch is more convenient, and is preferred. A potential across the load circuit greater than the open circuit voltage of battery 47 is defined as a "high" voltage for the purpose of the invention. In practice, a high voltage usually has a value corresponding to the algebraic sum of the voltage of battery 47, and a voltage approaching the value of the voltage of source 18, or half of that source voltage.

However, any voltage greater than the open circuit voltage of the battery falls within the definition of high voltage. A voltage whose magnitude is less than the open circuit voltage of battery 47 is called a "low" voltage. A voltage measurement of zero or near zero (less than 3 volts, for example, or a negative voltage), indicates an open circuit and is called a "very low" voltage.

If the switches 41 and 43 are adjusted so that the test is conducted across terminals 19 and 23 of the main distribution frame, the presence of a low voltage across the load circuit will indicate that the terminals 19 and 23 are bridged and that the terminals are properly wired. The symbol for that in FIG. 2 is "OK," i.e. a combination of coincidence and a low voltage indicates that the terminals are properly wired. On the other hand, if a voltage greater than the battery voltage is measured across those terminals, it is clear that the jumper from terminal 19 to 23 is missing, and that the higher voltage must be derived from the voltage source 18. If the voltage measured is very low, it is clear that the jumper is not there. Accordingly, in the chart in FIG. 2, it is indicated that a combination of high voltage, or very low voltage, and coincidence indicates an open circuit. Of course, if there is no coincidence, if measurement is taken across a pair of terminals that are not to be interconnected, then the presence of a high voltage, or a very low voltage, indicates that the circuit is OK. If there is no coincidence, and a low voltage is measured, it is an indication that there is a short circuit across the terminals across which the measurement is taken.

To protect the telephone circuit from damage or disruption, such as pulling in relays or activating switches, because of the inclusion of the test circuitry, the high voltage sensor is arranged so that upon sensing a high voltage it causes the switch 50 to remain open. That removes the battery 47 and the load from the telephone system whereby disruption or damage is prevented. Opening of switch 50 may have the effect of protecting resistor 48 from excessive current flow, but that is an incidental advantage of the system.

To facilitate interpretation of the test results, it is useful to include an indicating apparatus that will display or otherwise indicate the test results. A representative indication system is shown in FIG. 1. It includes the coincidence indicator 62, AND gates 64, 65, and 66, and indicator lamps 68, 69, and 70. The coincidence indicator is a device such as a comparitor of X and Y BCD coding which receives information about the relative positions of the movable contacts 39 and 40 of switches 41 and 43. It provides outputs to AND gates 64, 65 and 66 to indicates whether or not there is or is not coincidence. The coincidence indicator provides a high signal to AND gate 64 when there is coincidence, and it provides a high signal to AND gates 65 and 66 when there is no coincidence. The high volt sensor 58 provides a low signal to AND gate 64 except when a high voltage is measured across the load circuit. Similarly, the low volt sensor 60 provides a low signal to AND gate 65 and a low signal to AND gate 66, except when a very low voltage is measured, in the case of gate 65 and except when a low voltage is measured across the load circuit in the case of gate 66. If a high voltage, or a very low voltage, is measured at coincidence to indicate an open circuit, lamp 69 or 70 will be illuminated. If there is no coincidence, and a low voltage is measured to indicate a short circuit, lamp 68 will be illuminated. Illumination of lamps 69 and 70 indicates open circuit. Illumination of lamp 68 indicates short circuit, and a satisfactory, or correctly, wired set of terminals, is indicated by the absence of illumination of any lamp.

In a preferred form of the invention, the switches 41 and 43 are solid state switching circuits whose operation is under the control of a clock. To indicate that, a clock 74 and a switch control unit 72 have been shown in FIG. 1. The switch control 72 is shown to have outputs to the movable switch tap 39 and the movable switch tap 40, and to the coincidence indicator 62 whereby to represent that operation of the switches 41 and 43 and of the coincidence indicator 42 are synchronized by some kind of control unit. However, it is to be understood that the invention does not depend upon the inclusion of that automatic switching apparatus. The switching can be done manually, and coincidence indicated manually at the indicator 62.

The switch 41 can be replaced with a hand operated probe 56. The switch is made inoperative and the probe is placed in the circuit by actuation of the switch 52 to connect the diode 54 to the probe, rather than to conductor 42.

The battery 47 is shown in a dotted box 46. While the use of the battery is entirely feasible, it is more practicable to employ a solid state current source. A representative source is illustrated in FIG. 8. It includes a clipping circuit comprising a diode and a zener diode in series at the output terminal 140 whose function is to prevent the introduction of large transient signals into the test system. Otherwise, the circuit as shown in FIG. 8 is an ordinary current source. FIG. 1 indicates that only one source is required. However, a fully automatic system might include many current sources, or "drive" circuits arranged in rows and columns in the fashion indicated by boxes 502, 504, 506, and 508 of FIG. 5. Box 505 represents the circuit shown in FIG. 8, and the terminals 6 and 140 in FIG. 5 correspond to terminals 6 and 140 in FIG. 8. Terminal 140 corresponds to one of the output taps of switch 43. It is to be connected to one of the terminals of the main distribution frame corresponding to terminals 23, 24, 25, or 26 in FIG. 1. The corresponding terminal of drivers 504, 506, and 508 are each connected to a respectively associated one of the main distribution frame terminals at one side of the frame. Which one of the drive units is rendered conductive is controlled by decoders 512 and 514. The output of decoder 512 is applied to multiplexer 510 before being applied to the driver matrix. The function of the multiplexer is to connect and energize each driver of a column before any of the next row is energized. Both of the decoders are controlled in response to some kind of a sequence code, in this case, a binary coded decimal signal that is generated in a counter unit 402. That counter unit provides Y coded signals for application to decoder 512, and it provides Z coded signals for application to decoder 514. The counter operates under the control of a clock 404 when counting is enabled by the provision of an enable signal from a source labelled 406. In a practical case, the counters might be enabled continuously until a fault is detected at which time the enable signal would be discontinued or a "disable" signal would be applied.

In one embodiment of the invention, current flowing from the test unit to terminals at the other side of the main distribution frame are made to flow through a series of switches, one associated with each terminal of the main frame that is under test. Such circuits are sometimes called "sensor" circuits in the trade, and their arrangement is shown in FIG. 3 of the drawing where boxes 302, 304, 305, and 306 represent sensors arranged in rows and columns. They are capable of conducting and not conducting, depending upon signals applied at their terminals 3 and 4. Terminal 139 is an input terminal, and terminal 2 is an output terminal. Each sensor has its own input terminal. Their output terminals are all connected to the common point 300. Energization of the number 3 terminals of the sensors is controlled by the combination of multiplexor 310 and decoder 312 in response to the Y code which is applied from the counters 402 to the input of decoder 312. Energization of terminals 4 of all of the decoders is controlled by decoder 308 in a response to the Z code applied to its input from the Z code output of counters 402. The sensors are arranged in rows and columns. Decoder 312 controls energization of rows and decoder 308 controls energization of columns so that the several sensors can be rendered operative one at a time in response to the Y and Z codes. Terminal 139 corresponds to one of the switch taps of switch 41 in FIG. 1, and in practice, it would be connected to one of the terminals of the main distribution frame under test. The terminal of all of the other sensors that correspond to terminal 139 would be connected to a respectively associated one of the connectors at the right side of the main distribution frame of FIG. 1. Terminal 300 in FIG. 3 corresponds to the movable contact 39 of switch 41.

A representative sensor circuit is shown in FIG. 6. It comprises a transistor 602, a diode 64, the combination of a diode and zener diode 606, a second transistor 608, and a limiting resistor 610. The function of the diode network 606 is to eliminate transient spikes of either polarity whereby to protect the test apparatus. Diode 604 prevents reverse current flow. Transistor 602 is switched on or off to place the sensor into operation or out of operation. Switching is accomplished with transistor 608 which responds to the application of potential at terminals 3 and 4.

A representative load circuit, high volt sensor, and low volt sensor corresponding to elements 48, 50, 58, and 60 of FIG. 1 is shown in FIG. 7. In operation, terminal 200 in FIG. 7 is connected to terminal 300 in FIG. 3. Thus, the output of the sensor circuit is free to flow from terminal 300 to terminal 200, through a diode 702, through a load resistor 748 and a solid state switch 750, and thence to ground. When the transistor 750 is conductive, a circuit is completed from test equipment ground through the driver to terminal 140 to a terminal on one side of the main distribution frame of the telephone system. The circuit is continued through a jumper to the other side of the main distribution frame to a terminal 139. Current flows from that terminal through the switching transistor in the sensor to the sensor output terminal 2 to terminal 300 and then to terminal 200 and through elements 702, 748, and 750 back to test equipment ground. That ground or common connection of the test equipment is different from, and is isolated from, the ground of the telephone system whereby to avoid formation of a path in which the application of negative voltages to the test equipment would be possible.

The presence of low voltages between terminal 200 and test equipment ground is detected by a combination of differential amplifier 724 and voltage divider 720. One input of the differential amplifier 724 is connected to terminal 200 through the divider resistor 726. The other input terminal of the differential amplifier is connected to the tap of a potentiometer, one side of which is connected to the positive voltage source, and the other side of which is connected to test equipment system ground. The output of the differential amplifier is applied to one input of an NAND gate 728.

The other input terminal of the NAND gate 728 is connected to the output terminal of a high voltage sensor formed by transistor 712 and voltage divider network 714 and 716. Resistor 714 and 716 are connected between terminal 200 and test equipment system ground. The junction between those two resistors is connected to the base of transistor 712, the collector of which is connected to the positive voltage source through a load resistor 718. The emitter of the transistor is connected to ground. When the voltage at terminal 200 exceeds some selected amount, the bias on transistor 712 is changed. As a consequence, the transistor is turned on and off depending upon the magnitude of the voltage at terminal 200 so that the effective potential of the collector is transferred from ground or to the positive voltage of the system. That potential is applied to NAND gate 728. The signal is low on over voltage, and the signal from the differential amplifier is low when there is a low voltage. The output of the NAND gate is applied to a logic unit 730 which also receives information from the counter unit 402, or a comparitor, about whether or not the main distribution frame terminals are connected in coincidence or not in coincidence. The function of the logic unit is to provide an indication corresponding to what is provided by indicating lamps 68 and 70 of FIG. 1, and it supplies the enable signal to the counter unit 402.

The switching transistor 750 serves the same function as does the switch 50 in FIG. 1. It responds to operation of the high volt sensor which, as previously described, is formed by elements 712, 714, 716, and 718 in FIG. 7. Transistor 750 is turned on and off by control of current flow to its base through resistor 704 from NAND gate 706. The NAND gate is controlled by the output of NAND gate 708 one of whose inputs is connected to a clock 710, and the other of whose inputs is connected to the collector of transistor 712. If there is an over voltage, the collector goes low. The clock 710 is operated in synchronism with the clock 404, and indeed, may be the same clock. In any event, as clocking is applied to the counters, it is also applied to the NAND gate 708 so that, during the measurement interval, a low signal at the collector of transistor 712 will be made to furnish a signal at the base of transistor 750 that turns the transistor off.

While the foregoing description has assumed positive voltage measurements, it will be apparent to those of ordinary skill in the electronic arts that the polarity could be inverted so that negative or "below ground" voltages were measured. To do that, the test voltage source and the diodes would be reversed. The transistors would also be changed to change their direction of conduction. The language of the claims is intended to cover both directions of polarity.

Although I have shown and described certain specific embodiments of my invention, I am fully aware that many modifications thereof are possible. My invention, therefore, is not to be restricted except insofar as is necessitated by the prior art.

I claim:

1. A method of testing for, and indicating the existence of, proper connections and faults in electric system wiring intended to interconnect a series of first terminals with respectively associated ones of a series of second terminals in the circumstance in which at least some of said terminals are connected to electric circuits which include an electric power source, which method comprises the steps of:
   connecting the series combination of an impedance element and a test voltage source across a selected first terminal and a selected second terminal;
   measuring the potential appearing across said impedance element;
   indicating that there is a proper connection of said first terminal and said second terminal in said wiring in response to measurement of a voltage approaching the value but less than said test voltage in the circumstance in which said first and second terminals are to be connected;
   indicating an open circuit in response to measurement of a voltage greater than, or much less than, said test voltage in the circumstance in which said first and said second terminals are to be associated;
   indicating a short circuit connection of said first and said second terminals in response to measurement of a voltage approaching but less than said test voltage in the circumstance in which said first and said second terminals are not to be associated; and
   indicating a proper connection in response to measurement of a voltage higher than said test voltage, or much less than said test voltage, in the circumstance in which said first terminal and said second terminal are not to be associated.

2. The invention defined in claim 1 in which the impedance of said impedance element is made to exceed the impedance presented by said electric system at any pair of first and second terminals when the voltage measured across said first and second terminals exceeds the voltage of said test voltage source.

3. The invention defined in claim 2 in which the impedance of said impedance element is made to be less than the impedance presented by said electric system at any pair of first and second terminals when the voltage measured across said first and second terminals is less than the voltage of said test voltage source.

4. For use in testing the correctness of interconnections and the absence of interconnections across terminal points in an electrical system which may include an electrical power source at a given volage and which exhibits impedance within a given range of values across said terminal points, a continuity tester comprising, in combination:
   a load impedance;
   a source of test voltage having a voltage value less than that of said electrical power source;
   connection means for connecting said load impedance and the test voltage source in series across pairs of said terminal points;
   indicating means for indicating whether pairs of said terminal points are or are not interconnected in the form of means for measuring the voltage appearing across said load impedance; and
   impedance value establishing means responsive to the voltage measured by said indicating means for establishing the values of said load impedance at a value above that of said exhibited impedance in the event that the measured voltage is higher than said test voltage and at a value below that of said exhibited impedance in the event that the measured voltage is not higher than said test voltage.

5. The invention defined in claim 4 in which said load impedance comprises the series combination of a resistor and a switch, the circuit having impedance of a value less than said range of impedance values when the switch is closed and a value exceeding said range of impedance values when said switch is open; and
   in which said means for measuring voltage includes means for opening and closing said switch.

6. The invention defined in claim 4 which further comprises means for indicating whether the measured voltage exceeds the test voltage or has a magnitude substantially less than the test voltage, or, alternatively, lies in the range between the test voltage and a magnitude substantially less than the test voltage.

7. The invention defined in claim 6 in which said switch comprises a transistor the bias of which is made proportional to the voltage across said load circuit.

8. The invention defined in claim 6 which further comprises means for indicating whether the terminal points across which said load impedance is connected are or are not in coincidence.

9. The invention defined in claim 5 in which said means for measuring voltages comprises two voltage measuring circuits are sensitive to high voltages and one sensitive to low voltages.

10. The invention defined in claim 5 in which said test voltage source comprises a plurality of solid state current sources each connected between one end of said load impedance and a respectively associated one terminal of those pairs of terminals across which continuity measurement is to be made;
   means for rendering said current sources conductive in sequence one at a time; and
   means for determining and indicating whether the terminal to which the current source that is rendered conductive at any time is coincident with the other terminal to which said load impedance is connected at that time.

11. The invention defined in claim 10 which further comprises a plurality of sensors each connected between a terminal point of said system to which no one of said current sources is connected, and the other end of said load impedance;
   means for rendering said sensors conductive one at a time; and
   means for controlling said means for rendering said current sources conductive and said means for rendering said sensors conductive such that said current sources and said sensors are rendered conductive in a selected order or coincidence and non-coincidence.

12. The invention defined in claim 5 in which said load impedance comprises the series combination of a resistor having an impedance value less than a value in said range of impedance values and a solid state switch;
   a first voltage divider connected across said load impedance and means for turning said switch on when the voltage at the tap of the divider exceeds a given voltage value.

13. The invention defined in claim 12 which further comprises a differential amplifier having its inputs connected one to a voltage divider network connected across said load impedance and the other of its inputs connected to a voltage divider network energized from a fixed voltage source.

14. In a continuity testing system:
   a source of test voltage;
   a load impedance and means for connecting the load impedance in series with the source of test voltage;
   voltage measuring means for measuring the voltage appearing across said load impedance when the load impedance and test voltage source are connected across terminal points in a circuit to be tested;
   means responsive to said voltage measuring means for altering the value of the impedance such that it has a high value when the voltage appearing across the load impedance exceeds the test voltage, and so that it has a lower value when the voltage across the load impedance has a value below the test voltage; and
   indicating means comprising said voltage measuring means and means responsive to the voltage measured by said voltage measuring means for indicating whether or not the pair of terminals are or are not interconnected.

15. A method of testing for, and indicating the existence of, proper connections and faults in electric system wiring intented to interconnect a series of first terminals with respectively associated ones of a series of second terminals in the circumstance in which at least some of said terminals may be connected to electric circuits which include an electric power source, which method comprises the steps of:
   connecting the series combination of an impedance element and a test voltage source across a selected first terminal and a selected second terminal;
   measuring the potential appearing across said impedance element;
   indicating that there is a proper connection of said first terminal and said second terminal in said wiring in response to measurement of a voltage approaching the value but less than said test voltage in the circumstance in which said first and second terminals are to be connected;
   indicating an open circuit in response to measurement of a voltage greater than, or much less than, said test voltage in the circumstance in which said first and said second terminals are to be associated;
   indicating a short circuit connection of said first and said second terminals in response to measurement of a voltage approaching but less than said test voltage in the circumstance in which said first and said second terminals are not to be associated; and
   indicating a proper connection in response to measurement of a voltage higher than said test voltage, or much less than said test voltage, in the circumstance in which said first terminal and said second terminal are not to be associated.

* * * * *